United States Patent
Bridges et al.

(10) Patent No.: US 10,746,777 B2
(45) Date of Patent: Aug. 18, 2020

(54) STRAY CURRENT SENSOR

(71) Applicant: L.B. Foster Company, Pittsburgh, PA (US)

(72) Inventors: Jacob Bridges, Pittsburgh, PA (US); Korhan Ciloglu, Pittsburgh, PA (US)

(73) Assignee: L. B. Foster Company, Pittsburgh, PA (US)

( * ) Notice: Subject to any disclaimer, the term of this patent is extended or adjusted under 35 U.S.C. 154(b) by 0 days.

(21) Appl. No.: 15/376,225

(22) Filed: Dec. 12, 2016

(65) Prior Publication Data

US 2017/0168106 A1 Jun. 15, 2017

Related U.S. Application Data

(60) Provisional application No. 62/266,380, filed on Dec. 11, 2015.

(51) Int. Cl.
*G01R 31/00* (2006.01)
*G01R 31/02* (2006.01)
*G01R 31/50* (2020.01)

(52) U.S. Cl.
CPC ........... *G01R 31/008* (2013.01); *G01R 31/50* (2020.01)

(58) Field of Classification Search
CPC .. G01R 31/008; G01R 31/025; G01R 31/007; G01R 31/1245; G01R 31/021; G01R 31/02; G01R 31/1236; G01R 31/1272; G01R 15/142; G01R 15/14; G01R 1/07; G01R 27/2617; G01R 27/025; G01R 27/18; G01R 29/0842; G01R 31/005; B61L 1/20; B61L 1/165; B61L 1/169; B61L 1/18; B61L 1/181; B61L 23/044; B61L 23/00

USPC ....................................................... 324/551

See application file for complete search history.

(56) References Cited

U.S. PATENT DOCUMENTS

| | | | | |
|---|---|---|---|---|
| 4,833,415 | A | * | 5/1989 | Nourai ................. G01R 31/025 324/551 |
| 6,633,169 | B1 | * | 10/2003 | Cavigelli ............. G01R 31/025 324/127 |
| 9,261,549 | B2 | * | 2/2016 | Phillips .................. G01R 31/02 |
| 2011/0012616 | A1 | * | 1/2011 | Hyde ................. G01R 31/1245 324/551 |
| 2011/0101989 | A1 | * | 5/2011 | Hyde ................. G01R 31/1245 324/527 |

(Continued)

FOREIGN PATENT DOCUMENTS

CN 103915228 * 7/2014

OTHER PUBLICATIONS

English Machine Translation of Liu et al. CN 103915228.*

*Primary Examiner* — Lee E Rodak
(74) *Attorney, Agent, or Firm* — Paul D. Bangor, Jr., Esq.; Clark Hill, PLC

(57) ABSTRACT

A sensor for detecting electrical current on an insulating element of a rail system, comprising: at least one electrically conductive lead or wire for attaching the sensor to the insulating element; an energy harvester for harvesting electric current transmitted from the insulating element to the energy harvester via the lead; a microprocessor circuit including a capacitor wherein the capacitor is charged by energy harvested by the energy harvester; and a transmitter for wirelessly transmitting RF signals indicative of the detected current; wherein the microprocessor and transmitter are powered by the energy from the capacitor.

13 Claims, 3 Drawing Sheets

(56) References Cited

U.S. PATENT DOCUMENTS

| | | | |
|---|---|---|---|
| 2013/0179099 A1* | 7/2013 | Knijnik | G01R 31/1245 |
| | | | 702/58 |
| 2015/0108966 A1* | 4/2015 | Kadonoff | G01R 19/00 |
| | | | 324/127 |
| 2015/0128733 A1* | 5/2015 | Taylor | H02J 7/025 |
| | | | 73/865.8 |
| 2015/0168472 A1* | 6/2015 | Phillips | G01R 31/025 |
| | | | 324/551 |
| 2016/0209445 A1* | 7/2016 | McCammon | G01R 31/021 |
| 2016/0252563 A1* | 9/2016 | Church | G01R 31/1227 |
| | | | 324/551 |

* cited by examiner

STRAY CURRENT SENSOR

CROSS REFERENCE TO RELATED APPLICATIONS

This application claims the benefit of the filing date of U.S. provisional patent application Ser. No. 62/266,380, filed on Dec. 11, 2015, the entirety of which is incorporated herein by reference for all purposes.

BACKGROUND

Stray currents cause damage to railway and surrounding infrastructure in electrified railway systems. Various railway products such as third rail insulators and rail fasteners are designed to possess high electrical insulation capability to ensure the path of electric power and return currents flow in the railway environment as designed. However, harsh environmental conditions, especially in old subway tunnels create the environment for these currents to stray away from their intended path, causing substantial corrosive damage. Thus, it would be desirable to enable monitoring of stray currents as they occur through electrical leakage paths such as on the surface of third rail insulators via a hand held non-contact device or a train mounted receiver. The same concept can be used on other potential leakage paths such as electrically insulating rail fixation plates and overhead catenary lines.

Many transit agencies use third rails to transmit traction power to train cars. Third rails are separated by insulators 10 from railroad ties and the underlying track structure. The insulators are placed roughly at every ten feet carrying the continuous third rails and they are made of fiber reinforced compression molded plastics or porcelain materials (FIG. 1). Debris build-up on insulator elements (FIG. 2), especially in tunnels cause stray currents to leak on outer surfaces of insulators which result in destruction of the insulator itself and/or lead to rapid degradation of track infrastructure and/or other infrastructure elements such as utility lines around the railway track. Stray current related damage causes service disruptions and creates unplanned maintenance events when the damage is contained within the track structure, but it can also lead to major problems if surrounding infrastructure such as utility lines are damaged.

SUMMARY

One aspect of a preferred embodiment of the present disclosure comprises a sensor for detecting electrical current on an insulating element of a rail system, comprising: at least one electrically conductive lead or wire for attaching the sensor to the insulating element; an energy harvester for harvesting electric current transmitted from the insulating element to the energy harvester via the lead; a microprocessor circuit including a capacitor wherein the capacitor is charged by energy harvested by the energy harvester; and a transmitter for wirelessly transmitting RF signals indicative of the detected current; wherein the microprocessor and transmitter are powered by the energy from the capacitor.

In another aspect of a preferred sensor of the present disclosure, the insulating element comprises a third rail insulator or an insulating rail fixation plate or similar insulating elements.

In yet another aspect of a preferred sensor of the present disclosure, the transmitter on the sensor transmits a signal to a receiver wherein such transmission takes place continuously every time the capacitor is charged until such charge is dissipated.

In another aspect of a preferred sensor of the present disclosure, after the capacitor has been charged, the transmitter transmits a signal to a receiver only after being woken up by an RF wake-up signal.

In an additional aspect, a preferred sensor of the present disclosure further comprises a temperature sensor for sensing the temperature of the insulating element.

In another aspect of a preferred sensor of the present disclosure, the transmitter transmits RF signals indicative of the current detected by the sensor and the temperature of the insulating element.

In an additional aspect, a preferred sensor of the present disclosure further comprises a second electrically conductive lead or wire, spaced from the other lead, wherein both leads are used to attach the sensor to the insulating element and for conducting current from the insulating element to the sensor.

In another aspect, a preferred sensor of the present disclosure further comprises a memory for storing data representative of current detected or measured on the insulating element.

In yet another aspect of a preferred sensor of the present disclosure, the transmitter transmits to a cell phone.

In a further aspect of a preferred sensor of the present disclosure, the transmitter transmits the RF signals only after receiving a wake-up RF transmission.

In another aspect, a preferred sensor of the present disclosure further comprises a battery for storing energy from the energy harvester.

In yet another aspect of a preferred sensor of the present disclosure, the conductive lead extends around a substantial part of a perimeter of the insulating element.

In a further aspect of a preferred sensor of the present disclosure, the conductive lead extends entirely around a perimeter of the insulating element.

In another aspect of a preferred sensor of the present disclosure, each of the conductive leads extends around a substantial part of the insulating element.

In yet another aspect of a preferred sensor of the present disclosure, one or both of the conductive leads extend entirely around the insulating element.

In an additional aspect of a preferred sensor of the present disclosure, the receiver is located in a hand-held device, onboard a train or in a stationary data collection device.

DETAILED DESCRIPTION

Figure 1:
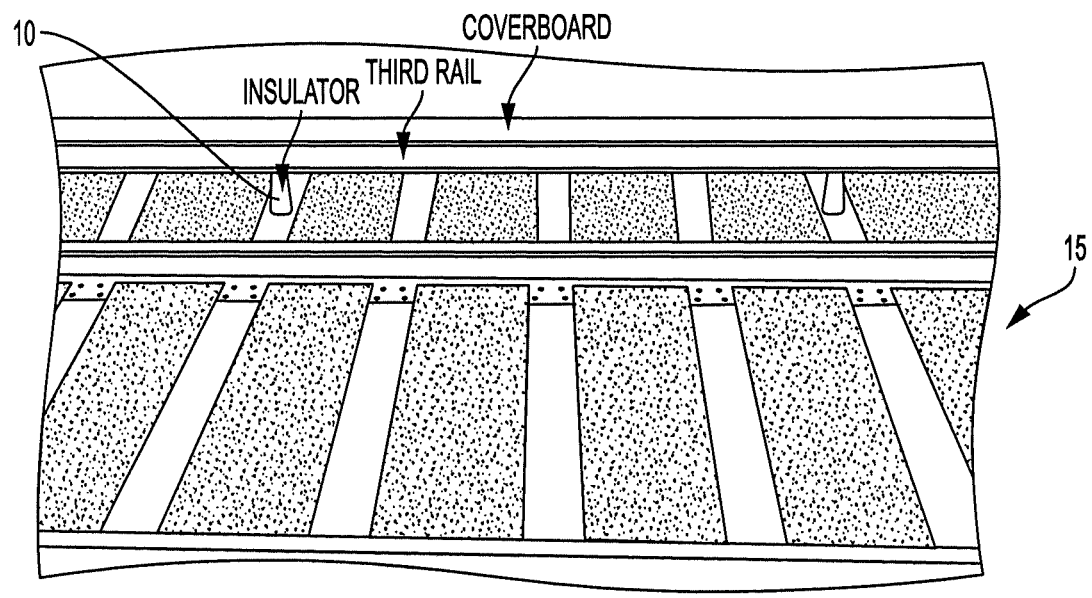
FIG. 1 is a perspective view of a third rail insulator installed as part of a railroad track.
Figure 2:
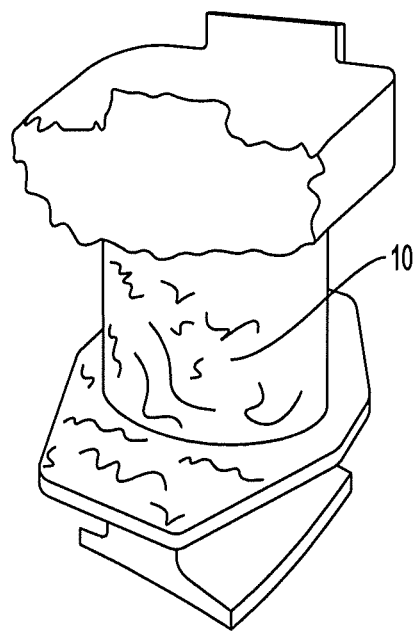
FIG. 2 is a perspective view of a used and dirty third rail insulator.

It should, of course, be understood that the description and drawings herein are merely illustrative and that various modifications and changes can be made in the structures disclosed without departing from the present disclosure. In the drawings hereof, like numerals refer to like parts throughout the several views.

Figure 3:
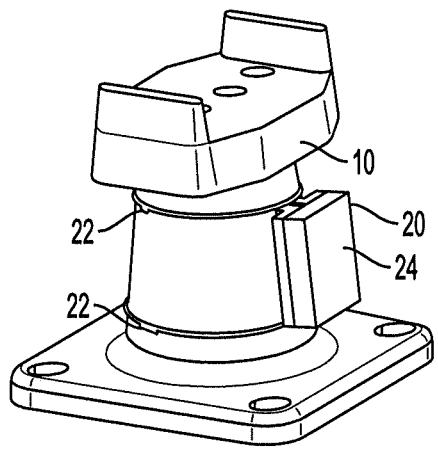
FIG. 3 is a perspective view of a stray current sensor of the present disclosure installed on a third rail insulator.
Figure 4:
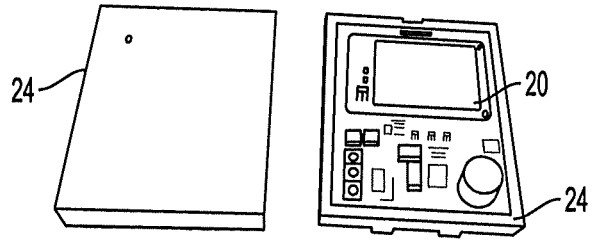
FIG. 4 is a perspective view of a stray current sensor of the present disclosure with its housing disassembled.

Various methods are available for measuring and locating stray currents in electrified railway systems. Some of these methods include measuring voltage drops between substations, various field measurements, and temperature measurement of insulating elements. However, none of these methods provide a quick and practical means of detecting stray currents. Furthermore, as the stray current amplitude gets smaller such currents become more elusive to detect with conventional methods. The stray current sensor of the present disclosure offers a quick and practical way of detecting stray currents on insulating elements of railway track, third rail insulators in particular. While the concept of the present disclosure is shown on third rail insulators, the same concept can be adopted to other insulating elements such as rail fasteners. FIGS. 3 and 4 show a preferred sensor 20 of the present disclosure and how the sensor 20 is preferably attached to an insulator 10 and its relative size and positioning on the insulator 10.

As shown in FIG. 3, electrically conductive leads/fasteners 22 are used to attach sensor housing 24 to insulator 10. Sensor housing 24 contains the components of wireless sensor 20 including temperature sensor 26, connectors for connecting leads 22, wide voltage (9 VDC to120 VDC) adaption micro-power switching regulator, power harvester 21 for harvesting power from stray current, 915 Mhz RF transmitter 29 micro-processor 23, antenna, optional test push-button and an optional LED for visual WAKE indication.

Figure 5:
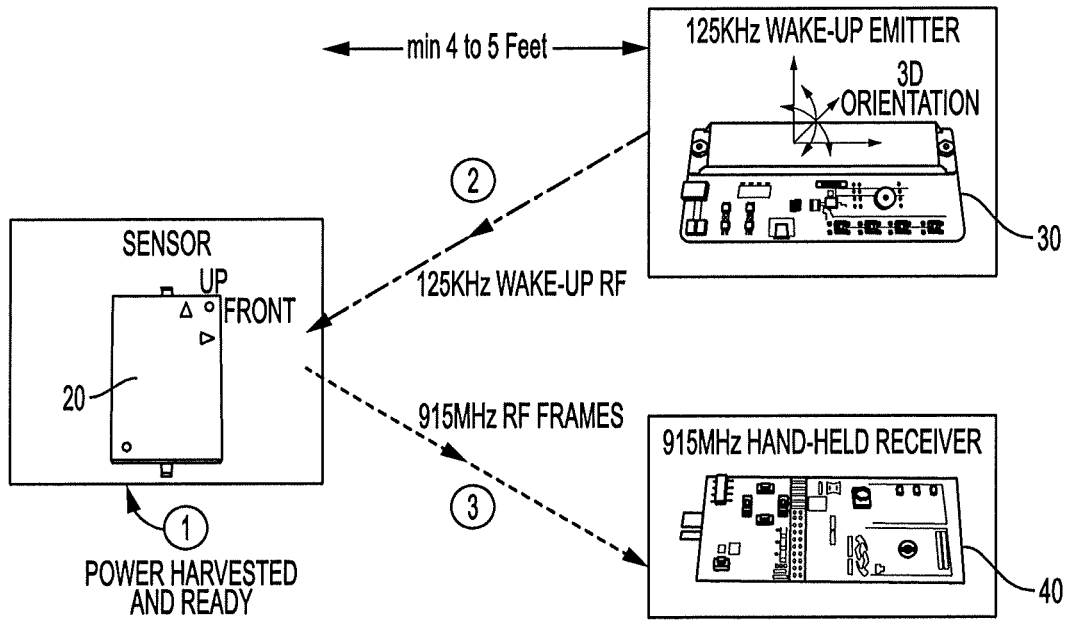
FIG. 5 shows perspective views of a stray current sensor of the present disclosure along with an emitter and a receiver for use with the same.
Figure 6:
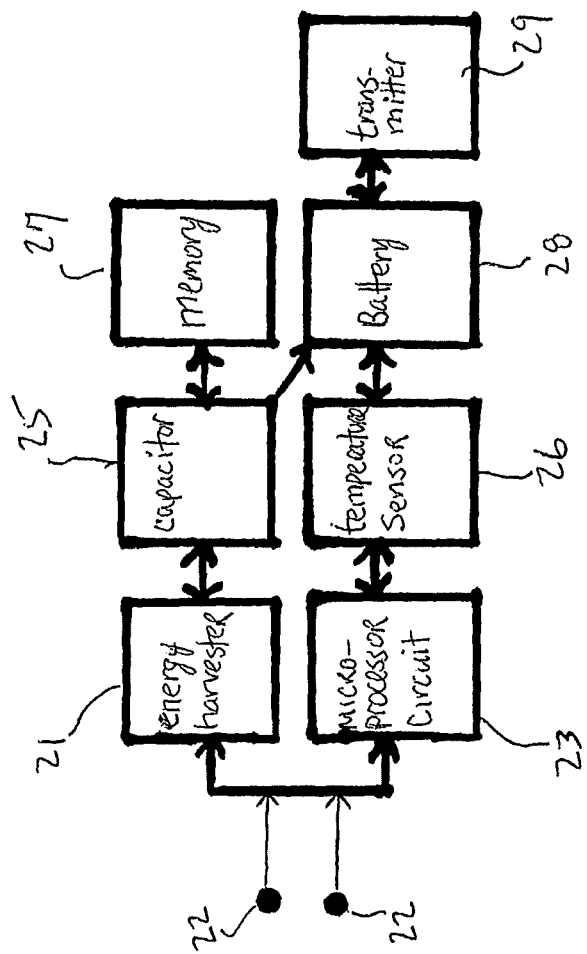
FIG. 6 shows a block diagram of a preferred stray current sensor of the present disclosure.

FIG. 5 shows a non-contact emitter 30 and receiver 40 for use with the sensor 20 of the present disclosure. The emitter 30 and receiver 40 may be produced together in the same enclosure or separately. Furthermore, they can be attached to a train (for use while train is in motion) or used as hand-held devices. In operation, sensor 20 detects (and in some cases measures) stray current via leads 22. Preferably, leads 22 extend around an entire perimeter (or substantial portion thereof) of insulator 10 (or other structure) on which sensor 20 is mounted. The power harvester 21 of sensor 20 harvests some of this stray current to power the sensor 20 so that it may detect and/or take measurements of stray current and take insulator surface temperature and transmit such data to a receiver 40 or a cell phone. In one preferred embodiment, the range of the transmitter in sensor 20 is about 10-20 feet (but may be longer as desired). In some cases, the emitter 30 preferably also has a short range of about 1-5 feet. The emitter 30 needs to be carefully positioned and triggered to avoid waking unintended sensors 20 in the vicinity of an intended sensor 20. Preferably, sensor 20 includes a capacitor 25 to store energy harvested from stray current processed by the power harvester 21. In such a preferred configuration the sensor 20 not only needs to have harvested enough power for signal transmission, but it also needs to be woken up by an emitter device 30 that preferably is hand-held or mounted on a train or other vehicle.

Sensor 20 alternatively may contain a battery 28, if desired, that may be charged/re-charged by energy harvested from stray current by the power harvester 21.

Preferably, sensor 20 includes a binary system that only detects whether or not current leakage has been encountered by sensor 20 and not the magnitude of such current leakage. If current leakage has been encountered by sensor 20, it will send a signal to receiver 40 after being woken up by the signal from emitter 30. Preferably, the signal sent by sensor 20 will contain a sensor ID number, a separate ID number for the transmitter of sensor 20 and a temperature reading from the structure (i.e., the insulator) on which the sensor 20 is installed. If no current leakage has been encountered by sensor 20, it will not send a signal to receiver 40 in response to the wake-up signal from emitter 30.

Preferably, sensor 20 may include a memory device 27 to store information about current leakage detected by sensor 20. More preferably, sensor 20 does not contain a memory 27 to reduce the cost and complexity of the sensor 20, a great number of which may be required to monitor a given rail line or portion thereof 15 (FIG. 1).

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the disclosure.

The invention claimed is:

1. A sensor for detecting electrical current on an insulating element of a rail system, comprising:
    a first electrically conductive lead or wire for attaching a housing of the sensor into physical contact with an outer perimeter of the insulating element and for conducting current from the insulating element to the sensor; wherein the first conductive lead extends around a substantial part of the outer perimeter of the insulating element near a top of the insulating element and wherein the first conductive lead is not embedded in the outer perimeter;
    a second electrically conductive lead or wire, spaced from the first conductive lead, wherein both the first and second leads are used to attach the housing of the sensor into physical contact with the outer perimeter of the insulating element and for conducting current from the insulating element to the sensor; wherein the second conductive lead extends around a substantial part of the outer perimeter near a bottom of the insulating element and wherein the second conductive lead is not embedded in the outer perimeter;
    an energy harvester for harvesting electric current transmitted from the insulating element to the energy harvester via the lead;
    a microprocessor circuit including a capacitor wherein the capacitor is charged by energy harvested by the energy harvester; and
    a transmitter for wirelessly transmitting RF signals indicative of the detected current; wherein the microprocessor and transmitter are powered by the energy from the capacitor;
    wherein the housing contains the energy harvester, the microprocessor circuit and transmitter.

2. The sensor of claim 1 wherein the insulating element comprises a third rail insulator or an insulating rail fixation plate or similar insulating elements.

3. The sensor of claim 1 wherein the transmitter on the sensor transmits a signal to a receiver wherein such transmission takes place continuously every time the capacitor is charged until such charge is dissipated.

4. The sensor of claim 3 wherein the receiver is located in a hand-held device, onboard a train or in a stationary data collection device.

5. The sensor of claim 1 wherein after the capacitor has been charged, the transmitter transmits a signal to a receiver only after being woken up by an RF wake-up signal.

6. The sensor of claim 1 further comprising a temperature sensor for sensing the temperature of the insulating element.

7. The sensor of claim 6 wherein the transmitter transmits RF signals indicative of the current detected by the sensor and the temperature of the insulating element.

8. The sensor of claim 1 further comprising a memory for storing data representative of current detected or measured on the insulating element.

9. The sensor of claim 1 wherein the transmitter transmits to a cell phone.

10. The sensor of claim 1 wherein the transmitter transmits the RF signals only after receiving a wake-up RF transmission.

11. The sensor of claim 1 further comprising a battery for storing energy from the energy harvester.

12. The sensor of claim 1 wherein the conductive lead extends entirely around a perimeter of the insulating element.

13. The sensor of claim 1 wherein one or both of the first and second conductive leads extend entirely around the insulating element.

\* \* \* \* \*